United States Patent
Giddens et al.

(10) Patent No.: US 6,703,952 B2
(45) Date of Patent: Mar. 9, 2004

(54) TESTING ANALOG-TO-DIGITAL AND DIGITAL-TO-ANALOG CONVERTERS

(75) Inventors: L. Grant Giddens, Raleigh, NC (US); Juan A. Espinoza, Wake Forest, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 43 days.

(21) Appl. No.: 10/166,156

(22) Filed: Jun. 10, 2002

(65) Prior Publication Data

US 2003/0227400 A1 Dec. 11, 2003

(51) Int. Cl.$^7$ ................................................. H03M 1/10
(52) U.S. Cl. ........................ 341/120; 379/377; 375/221
(58) Field of Search ..................... 341/120; 379/399.02, 379/387.02, 377, 353, 27.08, 27.07, 27.04, 27.03; 375/220, 221, 224

(56) References Cited

U.S. PATENT DOCUMENTS

| | | | |
|---|---|---|---|
| 3,603,772 A | * | 9/1971 | Paine et al. .................. 714/745 |
| 4,539,683 A | * | 9/1985 | Hahn et al. .................. 341/120 |
| 4,580,126 A | * | 4/1986 | Kato et al. ................... 341/120 |
| 4,736,189 A | * | 4/1988 | Katsumata et al. .......... 341/120 |
| 5,003,554 A | * | 3/1991 | Chism .......................... 375/224 |
| 5,132,685 A | * | 7/1992 | DeWitt et al. ............... 341/120 |
| 5,305,003 A | * | 4/1994 | Han ............................. 341/120 |
| 6,463,093 B1 | * | 10/2002 | Komara et al. .............. 375/220 |
| 6,566,857 B1 | * | 5/2003 | Kakizawa et al. ........... 324/120 |

* cited by examiner

Primary Examiner—Howard L. Williams
(74) Attorney, Agent, or Firm—Fogg and Associates, LLC; Scott V. Lundberg

(57) ABSTRACT

Testing of analog-to-digital and digital-to-analog converters formed in integrated circuits. In one embodiment, a method of testing an analog-to-digital (A/D) converter comprises applying an analog test signal of a first frequency to an input of the A/D converter. Sampling digital byte samples from an output of the A/D converter at a second sampling frequency and comparing select digital byte samples with each other. When the select digital byte samples match, storing a verify bit in a memory to verify the A/D converter is working. In another embodiment, a method of testing a digital-to-analog (D/A) comprises creating repeating digital byte samples with a logic circuit formed in the integrated circuit. Converting the repeating digital byte samples into an analog test signal with the D/A converter. Comparing the frequency of the analog test signal with the frequency of an expected analog signal to determine if the D/A converter is working.

43 Claims, 5 Drawing Sheets

TESTING ANALOG-TO-DIGITAL AND DIGITAL-TO-ANALOG CONVERTERS

TECHNICAL FIELD

The present invention relates generally to the testing of electronic converters and in particular the testing of analog-to-digital and digital-to-analog converters formed in integrated circuits.

BACKGROUND

Analog-to-digital (A/D) converters convert analog signals to digital signals. Moreover, digital-to-analog (A/D) converters convert digital signals to analog signals. A known method of testing an A/D converter is by applying a select analog test signal to the input of the A/D converter and monitoring the output of the converter for a code word formed from the test signal. If the code word matches an expected code word, the converter is verified as properly working. Similarly, a D/A converter can be tested by applying a select digital signal to an input of the D/A converter and monitoring the output of the converter for an analog signal. If the analog signal matches an expected analog signal, the converter is verified as properly working.

Conventional methods of testing A/D and D/A converters have limitations when the converters are formed as part of an integrated circuit. In particular, one limitation of a converter formed in an integrated circuit is accessing the converters inputs and outputs. That is, in some integrated circuits, there is no way to directly supply a signal to an input or monitor an output of the A/D or D/A converters. An example of an integrated circuit containing A/D and D/A converters that lack direct access to either the inputs or outputs of the A/D and D/A converters is a management card of a shelf unit in a telecommunication network. The lack of direct access to either the inputs or outputs of the A/D and D/A converters makes testing of the A/D and D/A converters difficult. Accordingly, it is desired in the art to have an effective method of testing A/D and D/A converters formed in integrated circuits.

For the reasons stated above and for other reasons stated below which will become apparent to those skilled in the art upon reading and understanding the present specification, there is a need in the art for an effective method of testing A/D and D/A converters formed in integrated circuits.

SUMMARY

The above-mentioned problems with testing A/D and D/A converters and other problems are addressed by the present invention and will be understood by reading and studying the following specification.

In one embodiment, a method of testing an analog-to-digital (A/D) converter formed in an integrated circuit is disclosed. The method comprises applying an analog test signal of a first frequency to an input of the A/D converter. Sampling digital byte samples from an output of the A/D converter at a second sampling frequency and comparing select digital byte samples with each other. When the select digital byte samples match, storing a verify bit in a memory to verify the A/D converter is working.

In another embodiment, another method of testing an analog-to-digital (A/D) converter formed in an integrated circuit is disclosed. The method comprises applying an analog test signal having a one kilohertz frequency to an input of the A/D converter. Sampling digital byte samples from an output of the A/D converter at an eight kilohertz frequency, wherein each digital byte sample is eight bytes. Comparing first and ninth digital byte samples and when the first and ninth digital samples match, verifying the A/D converter is working properly.

In another embodiment, a method of testing a digital-to-analog (D/A) converter formed in an integrated circuit is disclosed. The method comprises creating repeating digital byte samples with a logic circuit in a gate array formed in the integrated circuit. Converting the repeating digital byte samples into an analog test signal with the D/A converter. Comparing the frequency of the analog test signal with the frequency of an expected analog signal and when the analog test signal frequency matches the expected analog signal frequency, conveying that the D/A converter is working.

In another embodiment, another method of testing a digital-to-analog (D/A) converter is disclosed. The method comprises applying eight byte repeating digital samples to an input of the D/A converter at a frequency of eight kilohertz. Measuring the frequency of an analog output signal from an output of the D/A converter and when the frequency of the output signal is one kilohertz, conveying that the D/A converter is properly working.

In another embodiment, a method of testing an analog-to-digital (A/D) and a digital-to-analog (D/A) converter formed in an integrated circuit is disclosed. The method comprises applying an initial analog signal to an input of the A/D converter. Converting the initial analog signal into repeated digital byte samples with the A/D converter. Applying the repeated digital byte samples to an input of the D/A converter. Comparing an output analog signal of the D/A converter with the initial analog signal and when the output analog signal matches the initial analog signal, conveying that the A/D and D/A converters are properly working.

In another embodiment, an integrated circuit having an analog-to-digital (A/D) converter is disclosed. The integrated circuit includes a test access port and a gate array. The test access port is coupled to an input of the A/D converter. The test access port is adapted to receive an analog test signal of a select frequency. The gate array is coupled to an output of the A/D converter. Moreover, the gate array is adapted to compare select digital byte samples from an output of the A/D converter and to store a verify bit when a match is found, wherein the verify bit indicates the A/D converter is working properly.

In another embodiment, an integrated circuit having a digital-to-analog (D/A) converter is disclosed. The integrated circuit includes a test access port and a gate array. The test access port is coupled to an output of the D/A converter. The test access port is further adapted to receive analog signals from the D/A converter. The gate array is formed in the integrated circuit. The gate array is further adapted to supply repeated digital byte samples of a given frequency to the input of the D/A converter, wherein a tester can be coupled to the test port to measure the frequency of received analog signals in determining if the D/A converter is properly working.

In another embodiment, an integrated circuit having analog-to-digital (A/D) and a digital-to analog (D/A) converters is disclosed. The integrated circuit includes a test access port, a gate array, a loop back circuit and a logic circuit. The test access port is adapted to interface analog signals. The A/D converter has an input coupled to the test access port. The D/A converter has an output coupled to the test access port. The gate array is coupled to an output of the A/D converter and an input of the D/A converter. Moreover, the gate array is adapted to pass through received digital byte samples. The loop back circuit is adapted to receive digital byte samples from the gate array and selectively loop the digital byte samples back through the gate array during testing, wherein if the frequency of a looped back signal at the test access port matches the frequency of an initial test signal applied to the test access port, the A/D and D/A converters are verified as working properly.

In another embodiment, a management card of a shelf unit in a telecommunication network is disclosed. The management card includes a test access port, an analog-to-digital (A/D) converter, a digital-to-analog (D/A) converter and a gate array. The test access port is adapted to selectively interface analog signals to and from an external tester. The A/D converter having an input coupled to the test access port. The D/A converter having an output coupled to the test access port. The gate array is coupled to an output of the A/D converter and an input of the D/A converter. In addition, the gate array is adapted to compare select digital byte samples from the output of the A/D converter and to store a verify bit when a match is found during testing of the A/D converter.

In yet another embodiment, a testing system for analog-to-digital (A/D) and digital-to analog (D/A) converters in a management card of a shelf unit in a telecommunication network is disclosed. The testing system includes a tester and a management card. The tester is adapted to compare received analog signals frequencies with known analog signal frequencies and to create analog test signals of a select frequency. The management card includes a test access port, an analog-to-digital (A/D) converter, a digital-to-analog (D/A) converter and a gate array. The test access port is adapted to selectively interface analog signals to and from the tester. The A/D converter has an input coupled to the test access port. The D/A converter has an output coupled to the test access port. In addition, the gate array is adapted to supply repeated digital byte samples of a given frequency to an input of the D/A converter. The tester compares an output analog signal frequency of the D/A converter with an expected frequency to determine if the D/A converter is working during testing of the D/A converter.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Figures 1, 2:
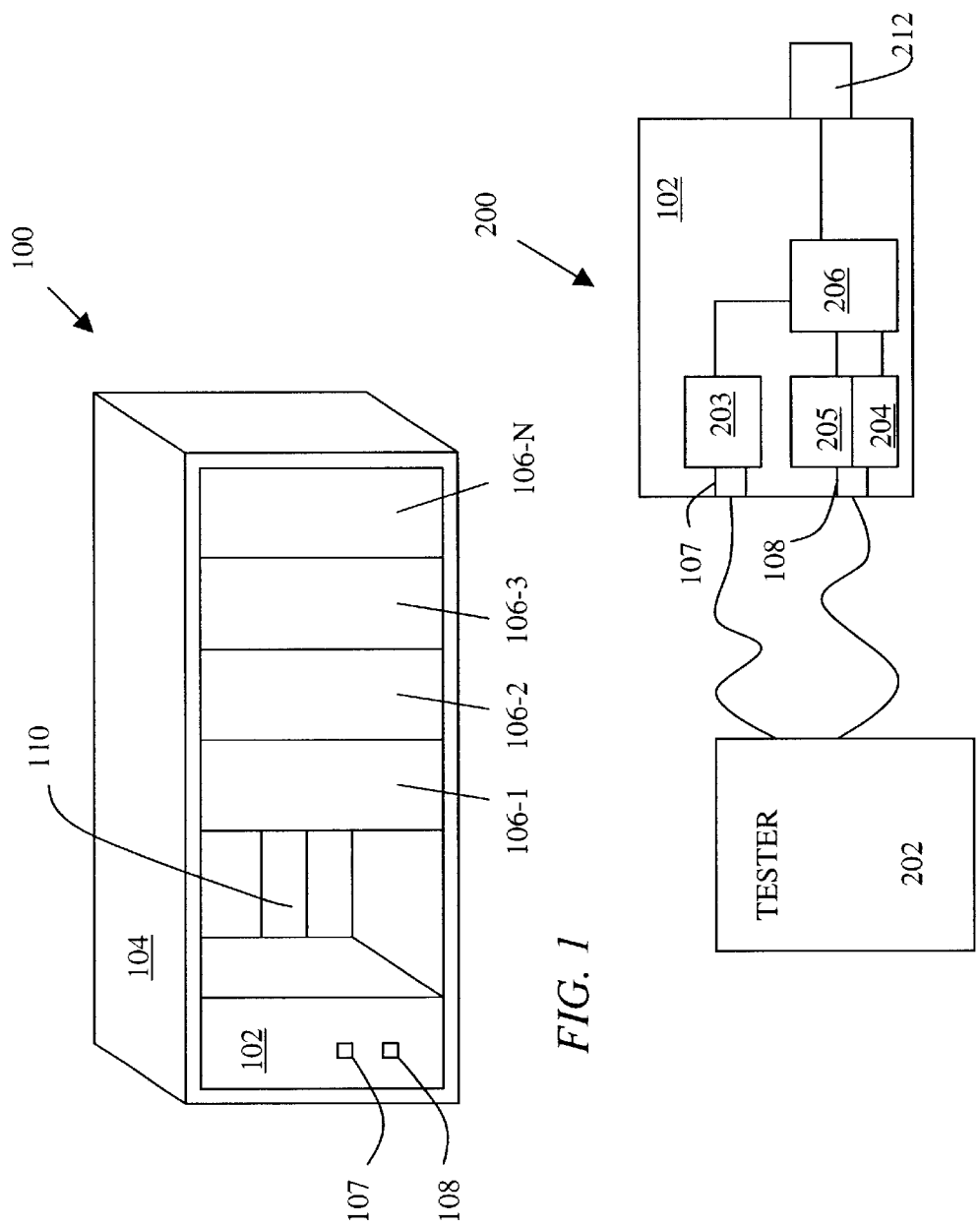
FIG. 1 is front perspective view of a shelf unit of one embodiment of the present invention.
FIG. 2 is a block diagram of one embodiment of the present invention.

Embodiments of the present invention provide ways to test analog to digital (A/D) converters and digital to analog (D/A) converters formed in an integrated circuit such as a management card of a telecommunication system. Referring to FIG. 1, a shelf unit 100 of one embodiment of the present invention is illustrated. Shelf unit 100 is shown containing line cards 106-1 to 106-N and management card 102. Management card 102 and line cards 106-1 to 106-N are adapted to be selectively coupled in the shelf unit 100. When the management card 102 and line cards 106-1 to 106-N are selectively coupled in the shelf unit 100, they are further coupled to each other via a backplane interface 110. Each line card provides one or more telephone lines to one or more end users. The management card 102 controls the functions of the line cards 106-1 to 106-N. The management card 102 includes a test access port 108 and a universal asynchronous receiving/transmitting port (UART) 107. The test access port 108 is used as phone jack to test phone lines. For example, if an end user is having problems with their phone line, a system administrator using the management card 102 can reroute the end user's phone line to the test access port 108 to isolate the problem. The UART port 107 is used for controlling test software and to communicate with testers.

The management card 102 is made of integrated circuits. A block diagram of a test system 200 of one embodiment of the present invention that includes management card 102 is illustrated in FIG. 2. As illustrated, management card 102 includes test access port 108, UART port 107, UART 203, A/D converter 204, D/A converter 205, gate array 206 and backplane port 212. The A/D converter 204 converts analog signals received at the test access port 108 into digital signals that are stored in and passed through gate array 206. The D/A converter converts digital signals passing through the gate array 206 into analog signals that are transmitted to the test access port 108. Since, the A/D and D/A converters 204 and 205 are formed in an integrated circuit with limited access to either the inputs or outputs of the A/D and D/A converters 204 and 205, it is difficult to test if they are functioning correctly before they are shipped off to customers. Embodiments of the present invention use the test access port 108 and the UART port 107 of the management card 102 to test the A/D and D/A converters 204 and 205 before they are shipped off to customers.

In one embodiment of the present invention, A/D converter 204 is tested by coupling tester 202 to the test access port 108. Tester 202, in this embodiment, is adapted to apply an analog test signal of a select frequency to the test access port 108. The analog test signal is converted by the A/D converter 204 to digital byte samples. The digital byte samples are received by the gate array 206. The gate array 206 is made of a plurality of logic circuits. The digital byte samples are shifted through the gate array 206. The logic circuits in the gate array 206 compare select digital byte samples with each other. If a match is found, a verifying bit is stored in the gate array 206 indicating the A/D converter working properly. System software of the management card then reads gate array 206 to determine if the verifying bit is present. If the verifying bit is present, the system software conveys to the system operator that the A/D converter 204 is properly working. In particular, in one embodiment, the gate array 206 directs a UART 203 to send verification via UART port 107 to tester 202. The tester 202 then conveys to the user the A/D converter 204 is working properly.

In one embodiment, the select frequency of the analog test signal is one kilohertz. In this embodiment, the digital byte samples from the A/D converter 204 in response to the analog test signals are sampled at a voice frequency of eight kilohertz. The digital byte samples in this embodiment are an eight byte repeating pattern which are continuously shifted through the gate array 206. Moreover, in this embodiment, the first and the ninth byte are compared. If the first and the ninth byte match, the verifying bit is set in the gate array 206 as described above.

Figure 2A:
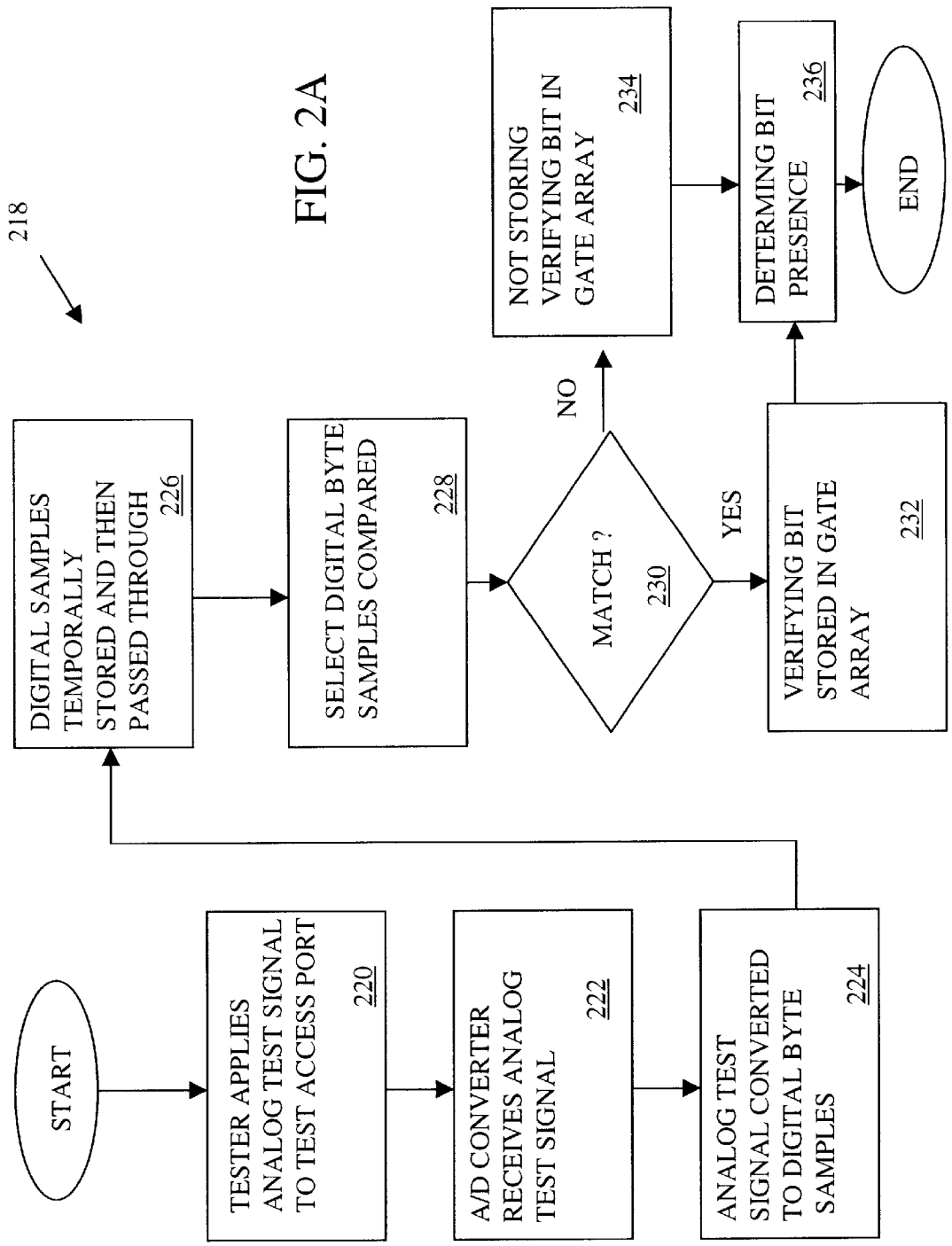
FIG. 2A is a flow chart illustrating one embodiment of a method of implementing the testing of an A/D converter of the present invention.

One embodiment of a method of implementing the testing of an A/D converter of the present invention is illustrated in flow chart 218 of FIG. 2A. As illustrated, the tester 202 applies an analog test signal of a given frequency to the test access port 108 (220). The A/D converter 204 receives the analog test signal (222). The analog test signal is converted to digital byte samples by the A/D converter 204 (224). The digital byte samples are temporarily stored and then passed through the memory array 206 (226). Select digital byte samples are compared (228). In determining which digital samples to compare, the given frequency of the analog test signal, the sampling frequency of the logic circuit 208 and the size of the bytes are taken into consideration. If a match of the digital samples is found (230), a verifying bit is stored in the gate array 206 (232). If a match of the digital samples is not found (230), a verifying bit is not stored in the gate array 206 (234). The gate array 206 is then read to determine the presence or lack of presence of a verifying bit (236). If a verifying bit is read in the gate array 206, the A/D converter 204 is verified as working properly. If a verifying bit is not read in the gate array 206, the A/D is not verified as working properly.

Further, in one embodiment, the D/A converter 205 is tested by sending repeated digital byte samples to an input of the D/A converter 205 from gate array 206. Tester 202 is coupled to the test access port 108 to receive an analog signal in response to the digital byte samples. If tester 202 detects an analog signal of an expected frequency, the tester 202 verifies the D/A converter 205 is working properly. In one embodiment, the repeated digital byte samples are produced at an eight kilohertz frequency with each sample being eight bytes long. In this embodiment, an analog signal having a frequency of one kilohertz is expected at the tester 202 to verify the D/A converter is properly working.

Figure 2B:
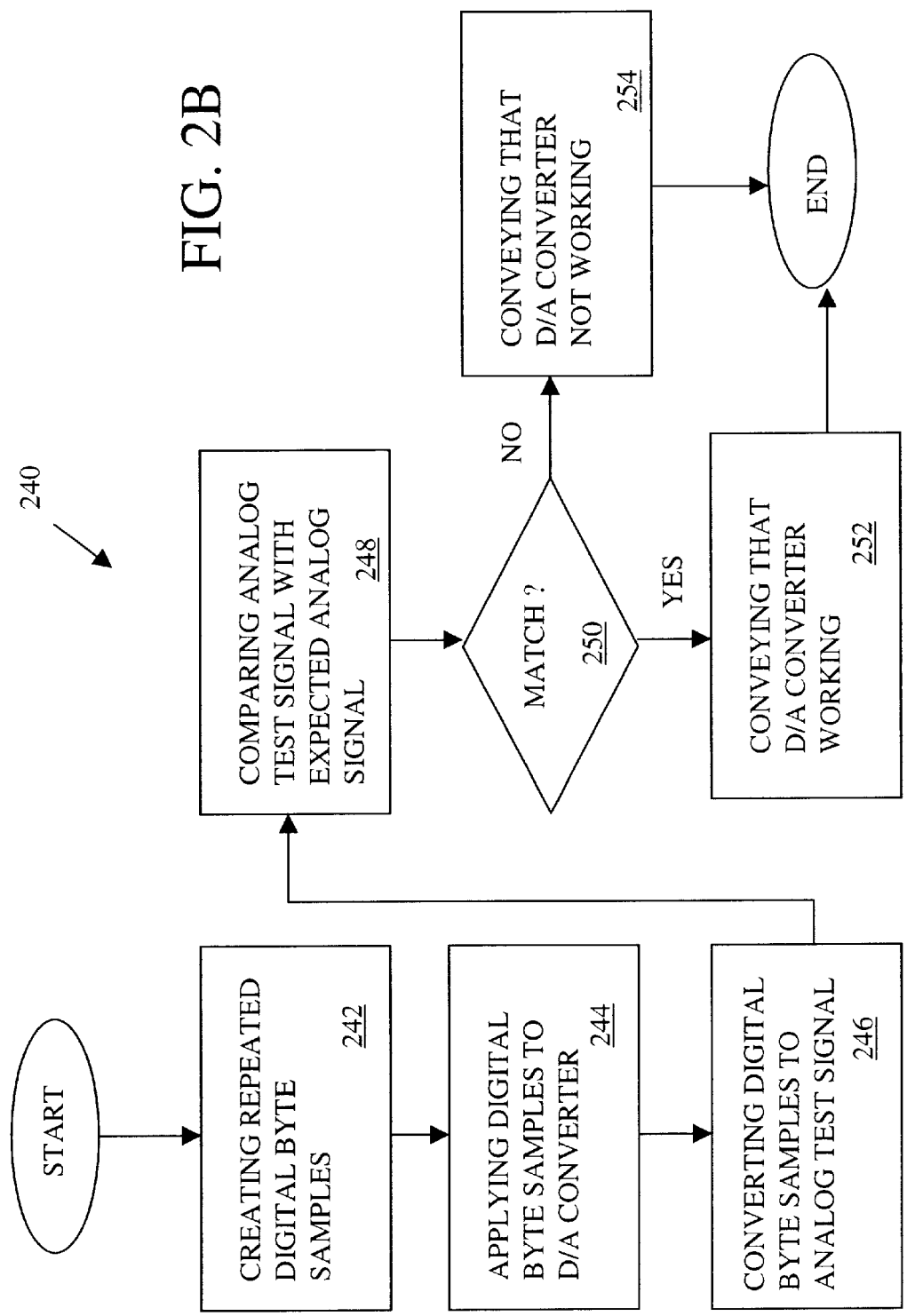
FIG. 2B is a flow chart illustrating one embodiment of a method of implementing the testing of a D/A converter of the present invention.

One embodiment of a method of implementing the testing of a D/A converter 205 of the present invention is illustrated in flow chart 240 of FIG. 2B. In flow chart 240, repeated digital samples are created by gate array 206 (242). The digital byte samples are applied to D/A converter 205 (244). The digital byte samples are converted to an analog test signal by the D/A converter 205 (246). The analog test signal is compared with an expected analog signal (248). That is, the expected analog signal is a signal that would be expected from the converted digital byte samples if the D/A converter was properly working. If a match is not found (250), the tester 202 conveys to a user the D/A converter is not working properly (254). If a match is found (250), the tester 202 conveys to the user the D/A converter is properly working (252).

Figure 3:
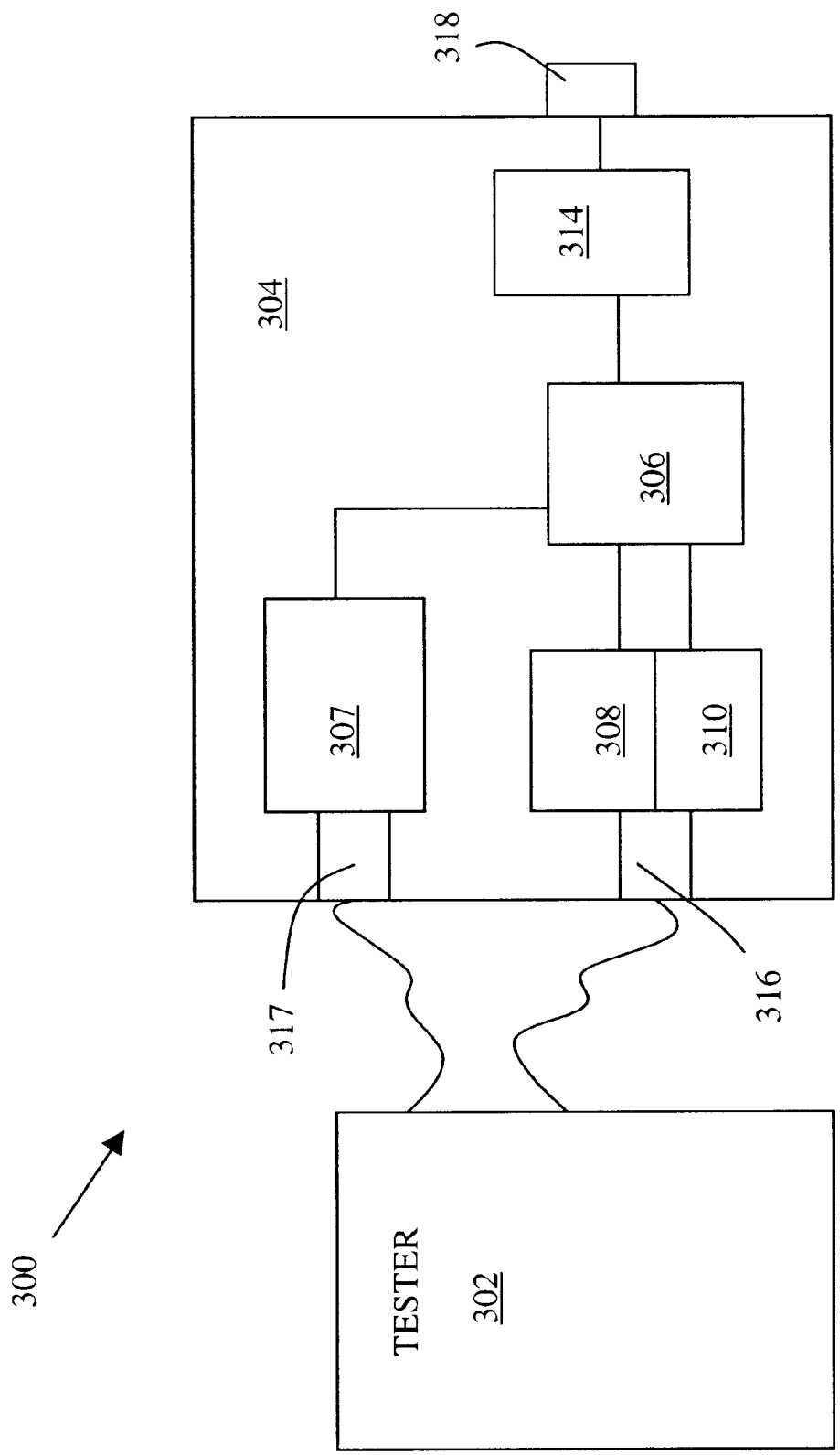
FIG. 3 is a block diagram of another embodiment of the present invention.
Figure 3A:
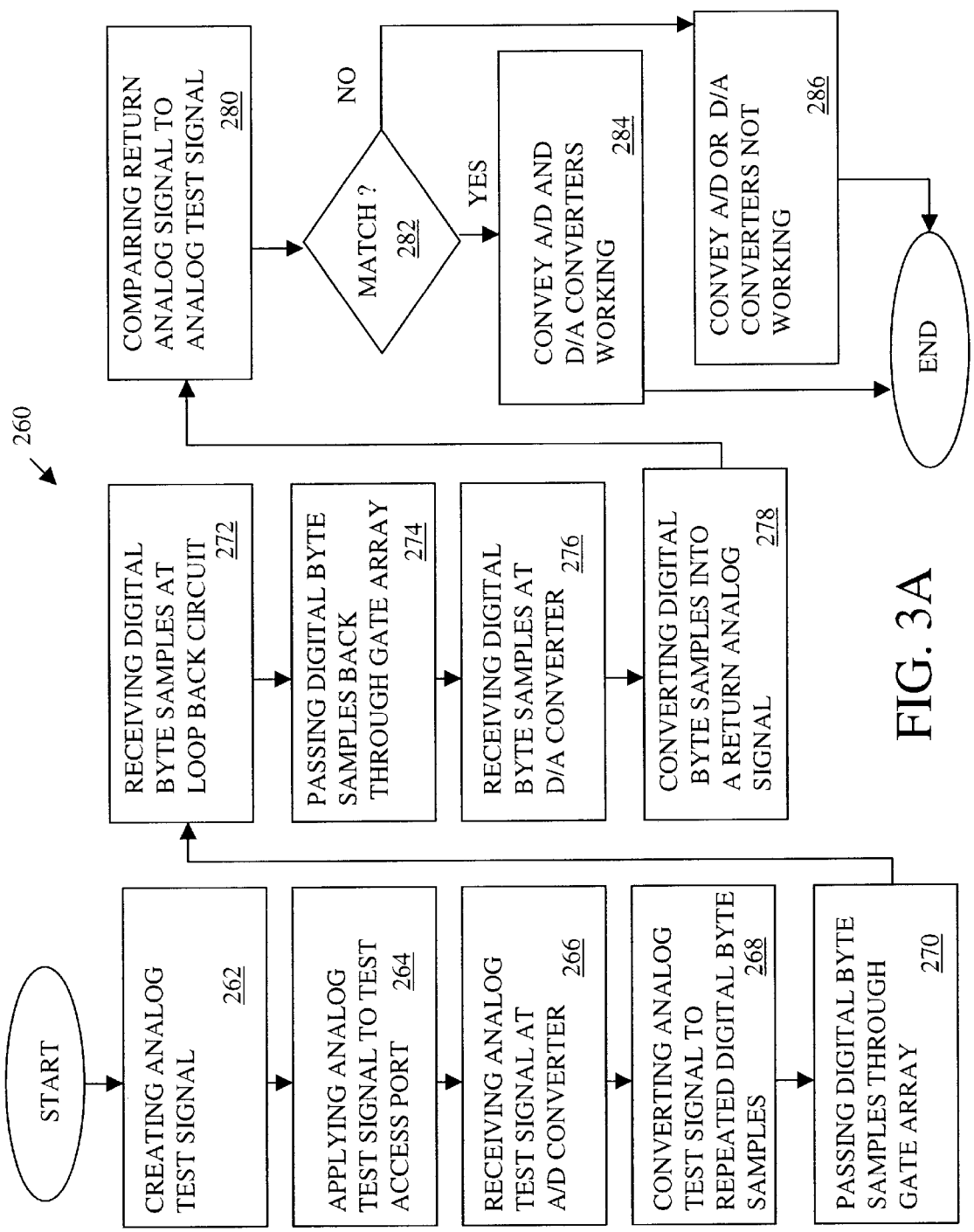
FIG. 3A is a flow chart illustrating one embodiment of a method of implementing the testing of A/D and D/A converters of the present invention.

Another test system 300 of one embodiment of the present invention is illustrated in FIG. 3. This embodiment includes a tester 302 and a management card 304. The management card 304 includes a gate array 306, UART 307, an A/D converter 308, a D/A converter 310, a test access port 316, UART port 317, a backplane port 318 and a loop back circuit 314. In this embodiment, a select test analog signal is applied to test access port 316 by tester 302. The A/D converter converts the analog signal into digital byte samples. The digital byte samples are stored in and passed through the gate array 306. During the testing, the tester 302 sends test instructions via the UART port 317. In one embodiment, the gate array 306, in response to test instructions, directs the loop back circuit 314 to route the digital byte samples back through the gate array 306 instead of the backplane port 318. The digital byte samples are then passed back through the gate array 306 to the D/A converter 310. In response to the digital byte samples at the D/A converter, the tester 302 receives an analog signal across the test access port 316. If the received analog signal matches the initial select analog test signal, the tester 302 confirms that the A/D and D/A converters are properly working.

One embodiment of a method of implementing the testing of a A/D and D/A converter 308 and 310 of the present invention is illustrated in flow chart 260 of FIG. 3B. In flow chart 260, an analog test signal is created by tester 302 (262). The analog test signal is applied to port (test access port) 316 (264). The analog test signal is received by the A/D converter 308 (266). The analog test signal is converted to repeated digital byte samples by the A/D converter 308 (268). The digital byte samples are passed through gate array 306 (270). The loop back circuit 314 receives the digital byte samples (272). The digital byte samples are passed back through the gate array 306 by the loop back circuit 314 (274). The D/A converter 310 then receives the digital byte samples (276). The digital byte samples are converted to a return analog signal by the D/A converter 310 ((278). The tester 302 then compares the return analog signal to the original analog test signal. If a match is not found (282), the tester 302 conveys to a user that one of the A/D or D/A converters 308 or 310 is not working (286). If a match is found (282), the tester 302 conveys to the user that the D/A and A/D converters 308 and 310 are working (284).

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention. Therefore, it is intended that this invention be limited only by the claims and the equivalents thereof.

What is claimed is:

1. A method of testing an analog-to-digital (A/D) converter formed in an integrated circuit, the method comprising:

applying an analog test signal of a first frequency to an input of the A/D converter;

sampling digital byte samples from an output of the A/D converter at a second sampling frequency;

comparing select digital byte samples with each other; and when the select digital byte samples match, storing a verify bit in a memory to verify the A/D converter is working.

2. The method of claim 1, further comprising;
reading the memory for the verify bit; and
when the verify bit is read, conveying that the A/D converter is working properly.

3. The method of claim 1, wherein the select digital byte samples that are compared to each other are related to the first and second sampling frequencies and the number of bytes in each sample.

4. The method of claim 1, wherein the first frequency is one kilohertz, the second sampling frequency is eight kilohertz, there are eight bits in each sample and first and ninth digital byte samples are compared with each other.

5. A method of testing an analog-to-digital (A/D) converter formed in an integrated circuit, the method comprising:
applying an analog test signal having a one kilohertz frequency to an input of the A/D converter;
sampling digital byte samples from an output of the A/D converter at an eight kilohertz frequency, wherein each digital byte sample is eight bytes;
comparing first and ninth digital byte samples; and
when the first and ninth digital samples match, verifying the A/D converter is working properly.

6. The method of claim 5, further comprising:
storing nine consecutive eight byte digital samples from an output of the A/D converter in a gate array.

7. The method of claim 6, wherein a continuous stream of nine consecutive eight byte digital samples are shifted though the gate array.

8. The method of claim 5, further comprising:
when the first and the ninth digital samples match, storing a verify bit in a gate array.

9. The method of claim 8, further comprising:
reading the verify bit in the gate array; and
conveying that the A/D converter is working properly.

10. A method of testing a digital-to-analog (D/A) converter formed in an integrated circuit, the method comprising:
creating repeating digital byte samples with a logic circuit in a gate array formed in the integrated circuit;
converting the repeating digital byte samples into an analog test signal with the D/A converter;
comparing the frequency of the analog test signal with the frequency of an expected analog signal; and
when the analog test signal frequency matches the expected analog signal frequency, conveying that the D/A converter is working.

11. The method of claim 10, wherein each sample has eight bytes, the repeated digital byte samples are produced at an eight kilohertz frequency and the frequency of the expected analog signal is one kilohertz.

12. The method of claim 10; further comprising:
applying the repeated digital byte samples to an input of the D/A converter, and
outputting the analog test signal from an output of the D/A converter.

13. The method of claim 12, wherein a tester is coupled to receive the output of the D/A converter and is adapted to compare the analog test signal with the expected analog signal.

14. A method of testing a digital-to-analog (D/A) converter, the method comprising:

applying eight byte repeating digital samples to an input of the D/A converter at a frequency of eight kilohertz;
measuring the frequency of an analog output signal from an output of the D/A converter; and
when the frequency of the output signal is one kilohertz, conveying that the D/A converter is properly working.

15. The method of claim 14, wherein the eight byte repeating digital samples are created by a logic circuit formed in an integrated circuit with the D/A converter.

16. The method of claim 14, wherein a tester measures the frequency of the analog output signal.

17. A method of testing an analog-to-digital (A/D) and a digital-to-analog (D/A) converter formed in an integrated circuit, the method comprising:
applying an initial analog signal to an input of the A/D converter;
converting the initial analog signal into repeated digital byte samples with the A/D converter;
applying the repeated digital byte samples to an input of the D/A converter;
comparing an output analog signal of the D/A converter with the initial analog signal; and
when the output analog signal matches the initial analog signal, conveying that the A/D and D/A converters are properly working.

18. The method of claim 17, further comprising:
receiving the repeated digital byte samples from an output of the A/D converter at a gate array;
passing the repeated digital byte samples to a loop back circuit;
looping back the repeated digital byte samples back to the gate array; and
passing the repeated digital byte samples to the input of the D/A converter.

19. The method of claim 17, wherein the initial analog signal is supplied by an external tester.

20. The method of claim 17, wherein the output analog signal is compared to the initial analog signal by an external tester.

21. The method of claim 20, wherein the tester is adapted to convey that the A/D and D/A converters are properly working when the output analog signal and the initial analog signal match.

22. An integrated circuit having an analog-to-digital (A/D) converter, the integrated circuit comprising:
a test access port coupled to an input of the A/D converter, the test access port is adapted to receive an analog test signal of a select frequency;
a gate array coupled to an output of the A/D converter, the gate array is adapted to compare select digital byte samples from an output of the A/D converter and to store a verify bit when a match is found, wherein the verify bit indicates the A/D converter is working properly.

23. The integrated circuit of claim 22, further comprising:
an universal asynchronous receiver/transmitter (UART) port adapted to interface test instruction signals and test verify signals to and from an external tester; and
an UART coupled to the UART port, the UART is adapted to pass the test instruction signals to the gate array and transmit test verify bit signals back to the external tester.

24. The integrated circuit of claim 22, wherein the select frequency of the analog test signal is one kilohertz.

25. The integrated circuit of claim 24, wherein the gate array is adapted to sample the digital byte samples at a frequency of eight kilohertz and each digital sample is eight bytes.

26. The integrated circuit of claim 25, wherein the select digital byte sample that are compared are the first and ninth digital samples.

27. An integrated circuit having a digital-to-analog (D/A) converter, the integrated circuit comprising:
  a test access port coupled to an output of the D/A converter, the test access port is adapted to receive analog signals from the D/A converter; and
  a gate array formed in the integrated circuit, the gate array adapted to supply repeated digital byte samples of a given frequency to the input of the D/A converter, wherein an external tester coupled to the test access port measures the frequency of received analog signals in determining if the D/A converter is properly working.

28. The integrated circuit of claim 27, further comprising:
  an universal asynchronous receiver/transmitter (UART) port adapted to interface test instruction signals from the external tester; and
  an UART coupled to the UART port, the UART is adapted to pass the test instruction signals to the gate array.

29. The integrated circuit of claim 27, wherein the gate array is adapted to provide the repeated digital byte samples at a frequency of eight kilohertz with each digital byte sample having eight bits.

30. The integrated circuit of claim 29, wherein when the tester measures the frequency of the analog test signal to be one kilohertz, the A/D converter is verified as working properly.

31. An integrated circuit having analog-to-digital (A/D) and a digital-to analog (D/A) converters, the integrated circuit comprising:
  a test access port adapted to interface analog signals;
  the A/D converter having an input coupled to the test access port;
  the D/A converter having an output coupled to the test access port;
  a gate array coupled to an output of the A/D converter and an input of the D/A converter, the gate array adapted to pass through received digital byte samples; and
  a loop back circuit adapted to receive digital byte samples from the gate array and selectively loop the digital byte samples back through the gate array during testing, wherein if the frequency of a looped back signal at the test access port matches the frequency of an initial test signal applied to the test access port, the A/D and D/A converters are verified as working properly.

32. The integrated circuit of claim 31 wherein the gate array is adapted to control functions of the loop back circuit.

33. The integrated circuit of claim 31, further comprising:
  an universal asynchronous receiver/transmitter (UART) port adapted to interface test instruction signals from the external tester; and
  an UART coupled to the UART port, the UART is adapted to pass the test instruction signals to the gate array.

34. A management card of a shelf unit in a telecommunication network, the management card comprising:
  a test access port adapted to selectively interface signals to and from an external tester;
  an analog-to-digital (A/D) converter having an input coupled to the test access port;
  a digital-to-analog (D/A) converter having an output coupled to the test access port; and
  a gate array coupled to an output of the A/D converter and an input of the D/A converter, the gate array adapted to compare select digital byte samples from the output of the A/D converter and to store a verify bit in the gate array when a match is found during testing of the A/D converter.

35. The management card of claim 34, wherein the gate array is further adapted to supply repeated digital byte samples of a given frequency to an input of the D/A converter during testing of the D/A converter.

36. The integrated circuit of claim 34, further comprising:
  an universal asynchronous receiver/transmitter (UART) port adapted to interface test instruction signals from the external tester; and
  an UART coupled to the UART port, the UART is adapted to pass the test instruction signals to the gate array.

37. The management card of claim 34, further comprising:
  a loop back circuit adapted to receive digital byte samples from the gate array and selectively loop the digital byte samples back to the gate array during testing of the A/D and D/A converters.

38. The management card of claim 37, wherein the loop back circuit is controlled by the gate array.

39. A testing system for analog-to-digital (A/D) and digital-to analog (D/A) converters in a management card of a shelf unit in a telecommunication network, the testing system comprising:
  a tester adapted to compare received analog signals frequencies with known analog signal frequencies and to create analog test signals of a select frequency; and
  a management card comprising,
    a test access port adapted to selectively interface analog signals to and from the tester;
    an analog-to-digital (A/D) converter having an input coupled to the test access port,
    a digital-to-analog (D/A) converter having an output coupled to the test access port, and
    an gate array adapted to supply repeated digital byte samples of a given frequency to an input of the D/A converter, wherein the tester compares an output analog signal frequency of the D/A converter with an expected frequency to determine if the D/A converter is working during testing of the D/A converter.

40. The testing system comprising of claim 39, wherein the logic circuit is further adapted to compare select digital byte samples from the output of the A/D converter and to store a verify bit in the gate array when a match is found during testing of the A/D converter.

41. The integrated circuit of claim 39, further comprising:
  an universal asynchronous receiver/transmitter (UART) port adapted to interface test instruction signals from the external tester; and
  an UART coupled to the UART port, the UART is adapted to pass the test instruction signals to the gate array.

42. The management card of claim 39, further comprising:
  a loop back circuit adapted to receive digital byte samples from the gate array and selectively loop the digital byte samples back to the gate array during testing of the A/D and D/A converters.

43. The management card of claim 42, wherein the loop back circuit is controlled by the gate array.

* * * * *